US009509265B2

(12) United States Patent
Krishnamurthi et al.

(10) Patent No.: US 9,509,265 B2
(45) Date of Patent: Nov. 29, 2016

(54) AMPLIFIER CIRCUIT

(71) Applicant: NXP B.V., Eindhoven (NL)

(72) Inventors: Kathiravan Krishnamurthi, Westford, MA (US); Yumin Lu, Chelmsford, MA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/540,559

(22) Filed: Nov. 13, 2014

(65) Prior Publication Data

US 2015/0137884 A1    May 21, 2015

(30) Foreign Application Priority Data

Nov. 15, 2013  (EP) ..................... 13193163

(51) Int. Cl.
*H03F 1/14*  (2006.01)
*H03F 3/72*  (2006.01)
(Continued)

(52) U.S. Cl.
CPC  *H03F 3/72* (2013.01); *H03F 3/19* (2013.01); *H03F 3/195* (2013.01); *H03G 1/0088* (2013.01); *H03F 2203/7239* (2013.01)

(58) Field of Classification Search
CPC .......... H03F 1/14; H03F 1/302; H03F 3/195; H03F 2203/7239; H03G 1/0088; H03G 3/34; H01L 27/082; H01L 29/73; H04B 1/06
USPC ............ 327/432, 439, 462, 575; 330/51, 86, 330/110, 149, 151, 191, 251, 254, 293, 302, 330/311
See application file for complete search history.

(56) References Cited

U.S. PATENT DOCUMENTS 6,522,195 B2   2/2003  Watanabe et al.
6,586,993 B2   7/2003  Macedo
(Continued)

FOREIGN PATENT DOCUMENTS

WO       02/47251 A2    6/2002

OTHER PUBLICATIONS

Schneider, Martin V., et al; "Harmonically Pumped Stripline Down-Converter"; IEEE Transactions on Microwave Theory and Techniques, vol. MTT-23, No. 3; pp. 271-275 (Mar. 1975).
(Continued)

*Primary Examiner* — Steven J Mottola
*Assistant Examiner* — Hafizur Rahman

(57) ABSTRACT

An amplifier circuit is disclosed comprising: an input terminal configured to receive a radio frequency input signal; an output terminal configured to provide a radio frequency output signal; a first transistor having a first collector, a first emitter, and a first base; a second transistor having a second collector, a second emitter, and a second base; a bypass switch; and a controller. The first base is connected to the input terminal and the second emitter. The first collector is connected to a circuit voltage supply and the output terminal. The first emitter is connected to ground and to the second base. The second collector is connected to a collector voltage supply. The bypass switch is connected between the first base and the output terminal. The controller is configured to operate the amplifier circuit in a normal mode of operation or a bypass mode of operation in accordance with an amplitude level of the radio frequency input signal, wherein the controller is configured to open the bypass switch in the normal mode of operation and close the bypass switch in the bypass mode of operation to selectively bypass the first transistor.

20 Claims, 3 Drawing Sheets

(51) Int. Cl.
*H03F 3/19* (2006.01)
*H03G 1/00* (2006.01)
*H03F 3/195* (2006.01)

(56) References Cited

U.S. PATENT DOCUMENTS

| | | | | |
|---|---|---|---|---|
| 6,680,641 | B1* | 1/2004 | Orr | H01L 27/0647 327/432 |
| 6,930,546 | B2* | 8/2005 | Floyd | H03F 1/223 330/151 |
| 8,055,230 | B1 | 11/2011 | Bidichandani et al. | |
| 2009/0298455 | A1* | 12/2009 | Takeuchi | H03F 1/22 455/296 |

OTHER PUBLICATIONS

Bergervoet, Jos et al; "A 1.95 GHz su-1 dB NF, +40 dBm OIP3 WCDMA LNA Module"; IEEE Journal of Solid-State Circuits, vol. 47, No. 7; 20 pages (Jul. 2012).

Yum, Tsz Yin et al; "Linearization of Mixers Using a Reconfigurable Transistor Pair for W-CDMA Mobile Terminals"; 2005 European Microwave Conference CNIT La Defense, Paris, France, Oct. 4-6, 2005; IEEE, Piscataway, NJ, USA; vol. 2; pp. 975-978 (Oct. 4, 2005).

Extended European Search Report for Application No. 13193163.6 (Apr. 28, 2014).

* cited by examiner

AMPLIFIER CIRCUIT

CROSS-REFERENCE TO RELATED APPLICATIONS

This application claims the priority under 35 U.S.C. §119 of European patent application no. 13193163.6, filed on Nov. 15, 2014, the contents of which are incorporated by reference herein.

This disclosure relates to amplifiers, and particularly, although not exclusively, to low noise amplifiers (LNAs) that may be configured for use with radio frequency (RF) signals, for example in wireless local area network (WLAN) applications.

Microwave and millimeter wave frequency amplifiers and LNAs are been increasingly realized in silicon bipolar and metal-oxide FET technologies with transit frequency, ft>100 GHz.

According to a first aspect of the invention there is provided an amplifier circuit comprising: an input terminal configured to receive a radio frequency input signal; an output terminal configured to provide a radio frequency output signal; a first transistor having a first collector, a first emitter, and a first base; a second transistor having a second collector, a second emitter, and a second base; a bypass switch; and a controller. The first base is connected to the input terminal and the second emitter; the first collector is connected to a circuit voltage supply and the output terminal; the first emitter is connected to ground and to the second base; the second collector is connected to a collector voltage source; and the bypass switch is connected between the first base and the output terminal. The controller is configured to operate the amplifier circuit in a normal mode of operation or a bypass mode of operation in accordance with an amplitude level of the radio frequency input signal, wherein the controller is configured to open the bypass switch in the normal mode of operation and close the bypass switch in the bypass mode of operation to selectively bypass the first transistor.

If the controller closes the bypass switch to bypass the first transistor, then in the absence of the second transistor, a device such as a series isolation switch would be required to prevent harmonic signal generation. Such a switch can be very difficult and expensive to implement for operation of the amplifier circuit at high frequencies using a standard silicon NMOS device, at least in part due to excessive losses. Advantageously, the second transistor in the amplifier circuit acts to cancel second harmonic distortions in the amplifier circuit. The first transistor may be considered a primary amplification device and the second transistor may be considered a harmonic cancelling device.

The controller may be configured to compare the amplitude level of the radio frequency input signal with a predetermined amplitude threshold to determine whether to operate in the normal mode of operation or in the bypass mode of operation. There may be a plurality of predetermined threshold levels to account for hysteresis and the controller may be configured to compare the amplitude level of the radio frequency input signal to a selected predetermined amplitude threshold.

The controller may be configured to operate in the bypass mode of operation when the amplitude level of the radio frequency input signal is above the predetermined amplitude threshold. The controller may be configured to operate in the normal mode of operation when the amplitude level of the radio frequency input signal is below the predetermined amplitude threshold.

The first transistor and second transistor may be matched. That is, the first and second transistors may be considered to be equivalent, or identical transistors, each connected in the amplifier circuit as described above. The first transistor and second transistor may each have one or more of: the same area; the same form factor; the same shape; and the same orientation.

By matching the first and second transistors, the amplifier circuit advantageously acts to cancel second harmonic distortions independently of any process variations. This is because the circuit in respect of the first and second transistor is symmetrical due to the transistors being matched/equivalent.

The amplifier circuit may comprise a bias circuit. The controller may be configured to control the bias circuit such that it provides a bias voltage to the first base of the first transistor in the normal mode of operation. The controller may be configured to control the bias circuit such that the bias voltage is disconnected from the first base of the first transistor in the bypass mode of operation.

The amplifier circuit may comprise a first emitter bias voltage source selectively connectable to the first emitter via a first emitter bias switch. The amplifier circuit may comprise a second emitter bias voltage source selectively connectable to the second emitter via a second emitter bias switch. The controller may be configured to operate the first emitter bias switch and the second emitter bias switch in the bypass mode of operation such that bias voltages are applied to the first emitter and the second emitter. The controller may be configured to operate the first emitter bias switch and the second emitter bias switch in the normal mode of operation such that bias voltages are disconnected from the first emitter and the second emitter.

By including first and second voltage sources, advantageously, the first and second transistors may be biased, which provides enhanced removal of signal distortion in the amplifier circuit and increases the linearity of the amplifier circuit.

The amplifier circuit may comprise a first capacitor. The first capacitor may be connected between a junction between the input terminal and the bypass switch, and the first base. The amplifier circuit may comprise a second capacitor. The second capacitor may be connected between a junction between the input terminal and the bypass switch, and the second emitter.

Advantageously, connecting first and second capacitors in this way desirably maintains the symmetry of the circuit in respect of the first and second transistors, and further, these capacitors act to prevent biases provided by the first and second voltage sources from interfering with each other by acting as DC blocks.

The first emitter bias voltage source may be configured to supply a voltage which is substantially half the voltage which the second emitter bias voltage source is configured to supply. This advantageously arises due to the symmetry of the circuit and provides for easier and more predictable amplifier circuit operation.

The amplifier circuit may comprise an input capacitor between the input terminal and a junction between the first base, the second emitter and the bypass switch. The amplifier circuit may comprise an output capacitor between the output terminal and a junction between the bypass switch, the first collector and a voltage source.

The amplifier circuit may comprise a pull-up inductor connected between ground and a junction between the bypass switch, the output terminal and the first collector. The amplifier circuit may comprise an input inductor connected between the input terminal and a junction between the first base, the second emitter and the bypass switch. The amplifier circuit may comprise a degeneration inductor connected between ground and a junction between the first emitter and the second base.

According to a further aspect of the invention, there is provided an electronic device comprising the amplifier circuit as described above.

According to a further aspect of the invention, there is provided an integrated circuit comprising the amplifier circuit as described above.

Embodiments will now be described by way of example with reference to the accompanying figures, in which.

One or more embodiments disclosed herein relate to an amplifier circuit configured to amplify a received radio frequency input signal when operating in a normal/high gain mode, and allow the signal to pass through the circuit without significant amplification when operating in a bypass mode. The amplifier circuit may include a pair of matched back-to-back transistors such that one of the transistors performs the amplification in the normal mode, yet the pair of transistors together may advantageously reduce or minimise even-numbered (as opposed to odd-numbered) harmonic interference in the output signal in the bypass mode. Matched transistors may each have the same form factor, shape, and/or orientation in the circuit. Orienting the transistors (of the same size/area) in a similar way side by side in the circuit acts to match them and can aid in process parameter tracking.

Throughout the following description, the amplifier circuit may be described as operating in a normal mode of operation or a bypass mode of operation. The normal mode may also be considered an active mode, a high gain mode, or an amplifier mode. The bypass mode may be considered a non-amplification mode, or a passive mode.

Low noise amplifiers (LNAs) may be implemented in bipolar processes for WLAN applications at 2.4 GHz and 5.8 GHz frequencies. Co-location of different frequency transceivers can require the receiver LNA to handle larger signals because the signal source may be positioned close to the amplifier. In other situations the signal source may be relatively far from the amplifier leading to small/weak received signals. When the LNA receives large input signals, an amplifier bias may be turned off and the amplifier device may then be bypassed using a switch. This is described below with reference to FIG. 1a. The signal levels in the bypass mode can generate harmonics even though the amplifier device is in an off state. The power level of harmonics returning to the antenna are required to be below −45 dBm in some applications.

Amplifier circuits described herein comprise at least one transistor. The transistors that are illustrated are bipolar junction transistors (BJTs) with terminals labelled as the base, collector, and emitter. In examples having two matching transistors as in FIGS. 2a-2c and 3a-3c, the paired transistors may have a common emitter/source, or be in a cascade or back-to-back configuration.

Figure 1A:
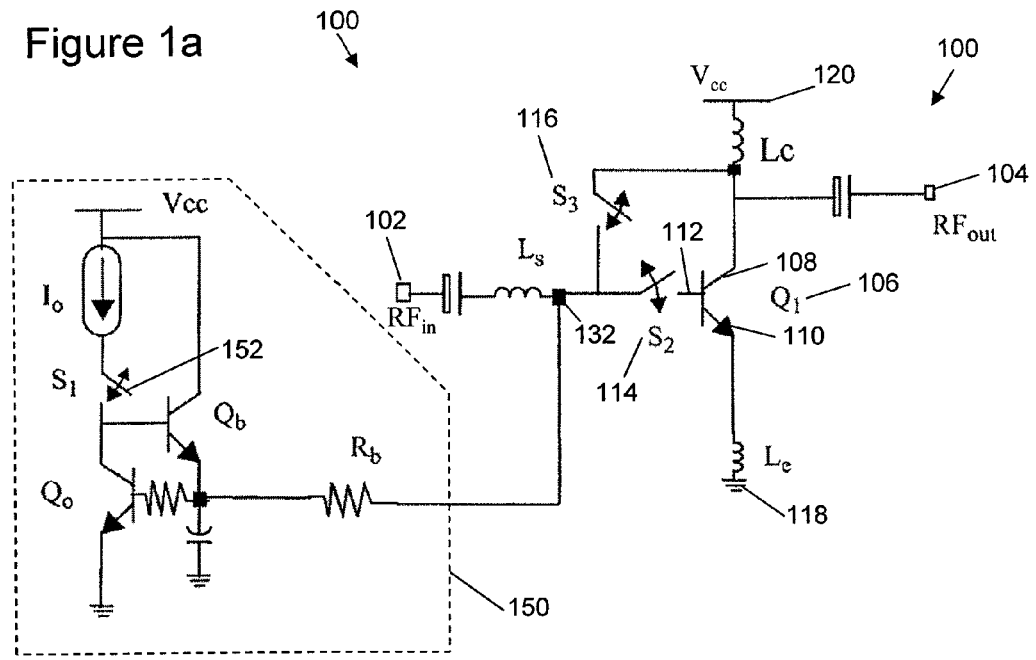
FIG. 1a illustrates a circuit diagram of an amplifier circuit comprising a bypass switch with the transistor base disconnected.

FIG. 1a illustrates an amplifier circuit which can operate in both a normal mode and a bypass mode. The normal mode of such an amplifier circuit may be used to amplify a weak received signal; that is, one with a low power level. It is important that as little noise as possible is added to the signal when it is being amplified, as the added noise will be amplified by the amplifier circuit along with the input signal, which is why LNAs can be used.

The amplifier circuit comprises an input terminal $RF_{in}$ 102 configured to receive a radio frequency input signal, and an output terminal $RF_{out}$ 104 configured to provide a radio frequency output signal. The amplifier circuit 100 also comprises a transistor $Q_1$ 106 having a collector 108, an emitter 110, and a base 112, a connection switch $S_2$ 114 and a bypass switch $S_3$ 116.

A bias circuit 150 is connected to a bias voltage node 132. The bias voltage node 132 is located between the input terminal $RF_{in}$ 102 and a first terminal of the connection switch $S_2$ 114. The second terminal of the connection switch $S_2$ 114 is connected to the base 112 of the transistor 106. The bias circuit 150 is configured to provide a bias voltage to the base 112 of the transistor $Q_1$ 106 when the circuit is operating in the normal mode. The bias circuit 150 comprises a bias switch $S_1$ 152 configured to close when the circuit 100 is operating in the normal mode to allow a bias voltage to be provided, and configured to open when the circuit 100 is operating in the bypass mode so that a bias current is not provided to the base 112 from the bias circuit 150.

The input terminal $RF_{in}$ 102 is connectable to the base 112 via the connection switch $S_2$ 114. The input terminal $RF_{in}$ 102 is connectable to the output terminal $RF_{out}$ 104 via the bypass switch $S_3$ 116. The collector 108 is connected to a circuit voltage supply $V_{cc}$ 120 and the output terminal $RF_{out}$ 104. The emitter 110 is connected to ground 118.

A large input signal provided at the input terminal $RF_{in}$ 102 may be very close in frequency to the output signal expected at the output terminal $RF_{out}$ 104. Thus it may be difficult to filter out interference caused by the input signal on the output signal when the transistor $Q_1$ 106 is used amplify large signals. It can therefore be undesirable to have a large input signal provided to the base 112 of the transistor $Q_1$ 106 as this can cause harmonic interference in the output signals. Therefore the transistor $Q_1$ 106 can be bypassed using the bypass switch $S_3$ 116 for large input signals, allowing the amplifier circuit 100 to operate in a bypass mode.

In the normal mode, the bias switch $S_1$ 152 and the connection switch $S_2$ 114 are closed, and the bypass switch $S_3$ 116 is open. Losses from the amplifier circuit 100 associated with the switch $S_2$ 114 may add to the noise figure of the amplifier circuit 100. Such additional losses may particularly cause concern when using an NMOS field effect transistor at higher RF and microwave frequencies. The noise levels in the output signal may be acceptably low if a smaller input signal is used. The connection switch $S_2$ 114 should have as low a loss as possible to reduce the noise in the amplifier circuit 100. Such a very low loss switch may require sophisticated technology. It can be very difficult, if not impossible, to have a connection switch $S_2$ 114 which achieves low enough losses for an acceptable amplifier to be provided.

Achieving an acceptable connection switch $S_2$ 114 can become more challenging as performance requirements increase. Switches typically do not have 0Ω resistance and they have a parasitic capacitance. A connection switch $S_2$ 114 can be made as large as possible to reduce losses, but it will still have an associated parasitic capacitance at high signal frequencies. The parasitic capacitance can be nonlinear, and may have an undesirable effect on the substrate of an integrated circuit on which the amplifier circuit is provided, which therefore also has an undesirable effect on the performance of the amplifier circuit.

In FIG. 1a, the amplifier circuit 100 can operate in a bypass mode when the bypass switch $S_3$ 116 is closed and the bias switch $S_1$ and the connection switch $S_2$ are open. The bypass mode can be used when a large input signal is received. The input signal may thus be routed directly from the input terminal $RF_{in}$ 102 to the output terminal $RF_{out}$ 104 in the bypass mode. This provides isolation of the base 112 of the transistor $Q_1$ 106 from the input signal under large input signal conditions.

By way of example, a small input signal may be considered a signal which is approximately 10-15 dB lower than the compression point of the amplifier. For example, for an input compression of 0 dB, a small signal may be considered to be a signal lower than −10 dBm. A large signal may be considered to be a signal which is closer to the compression point of the amplifier.

Figure 1B:
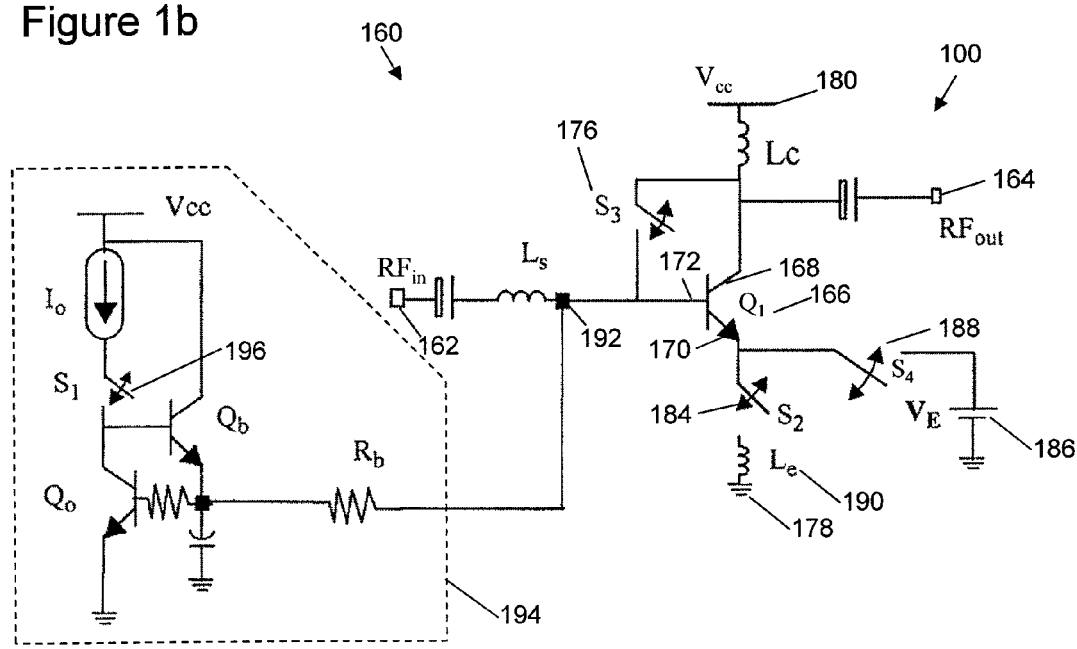
FIG. 1b illustrates a circuit diagram of an amplifier circuit comprising a bypass switch with the transistor emitter disconnected.

FIG. 1b illustrates another amplifier circuit 160 which can operate in both a normal mode and a bypass mode. The amplifier circuit 160 comprises an input terminal $RF_{in}$ 162, an output terminal $RF_{out}$ 164, a transistor $Q_1$ 166, a bias circuit 194 connected to a bias voltage node 192 located between the input terminal $RF_{in}$ 162 and the base 172 of the transistor $Q_1$ 166, and a bypass switch $S_3$ 176, as in FIG. 1a. An emitter bias voltage source $V_E$ 186 is connectable to the emitter 166 via an emitter bias switch $S_4$ 188. The connection switch $S_2$ 184 in FIG. 1b is in a different location to that of FIG. 1a, such that it need not necessarily be an extremely low loss switch as is required for the connection switch $S_2$ in the amplifier circuit of FIG. 1a. The connection switch $S_2$ of FIG. 1b is not directly in the series path between the input terminal $RF_{in}$ and the base 172 of the transistor $Q_1$, but it is instead connected between the emitter 170 and ground 178. In this example, an inductor $L_e$ 190 is connected in series between the connection switch $S_2$ 184 and ground 178.

Closing the connection switch $S_2$ 184 connects the emitter 170 to ground 178 via the inductor $L_e$ 190, allowing current to flow through the transistor $Q_1$ and therefore enabling the transistor $Q_1$ to be used as an amplifier. When the connection switch $S_2$ 184 is open, the emitter 170 is not connected to ground 178 and the transistor $Q_1$ cannot conduct and therefore cannot amplify.

The circuit can be operated in the normal mode by closing the bias switch $S_1$ 196, closing the connection switch $S_2$ 184, opening the emitter bias switch $S_4$ 188 and opening the bypass switch $S_3$ 176.

The circuit 160 can operate in the bypass mode by opening the bias switch $S_1$ 196, opening the connection switch $S_2$ 184, closing the emitter bias switch $S_4$ 188 and closing the bypass switch $S_3$ 176. The transistor $Q_1$ 166 may be considered to be turned off in the bypass mode. The transistor $Q_1$ 166 does not amplify the received signal in the bypass mode because the signal bypasses the transistor $Q_1$ 166 and passes from the input terminal $RF_{in}$ 162 through the closed bypass switch $S_3$ 176 to the output terminal $RF_{out}$ 164. The emitter bias switch $S_4$ 188 is closed in the bypass mode to reverse bias the transistor (acting as a diode) and enhance the linear performance when the circuit operates passively.

The nonlinear base-emitter junction of the transistor $Q_1$ 166 causes the transistor $Q_1$ 166 to behave similarly to a zero-biased diode, which is a distorting device and is therefore undesirable in the circuit. To reduce the likelihood of harmonics (such as second harmonics) creating signal distortions at the output terminal $RF_{out}$ 164 and also at the input terminal $RF_{in}$ 162, in this example the emitter bias voltage source $V_E$ 186 is connected to the emitter 170 by closing the emitter bias switch $S_4$ 188 in the bypass mode of operation. This acts to apply a reverse bias to the base-emitter junction of the transistor 166. Connecting a positive voltage $V_E$ 186 to the base-emitter junction causes it to be back-biased/reverse biased, which may reduce distortion in the amplifier circuit 160. This back-bias acts to linearise the transistor $Q_1$ 166 when the amplifier circuit 160 is operating in the bypass mode and therefore improve performance.

The back-bias applied from $V_E$ 186 can be, however, limited due to the small breakdown voltage of narrow and high speed SiGe base-emitter junctions of modern transistors. Further, the connection switch $S_2$ 184 should still be as large as possible (for example, a 2 mm switch) to be a low-loss device, and this can require a high on-chip area, which is not always desirable.

Therefore, when the amplifier circuit 160 of FIG. 1b is operating in the bypass mode, it is still possible to have unacceptably high levels of second harmonics at both the output terminal $RF_{out}$ 164 and the input terminal $RF_{in}$ 162. Such problems may be addressed by an amplifier circuit as described below in relation to FIGS. 2a-2c and FIGS. 3a-3c.

Figure 2A:
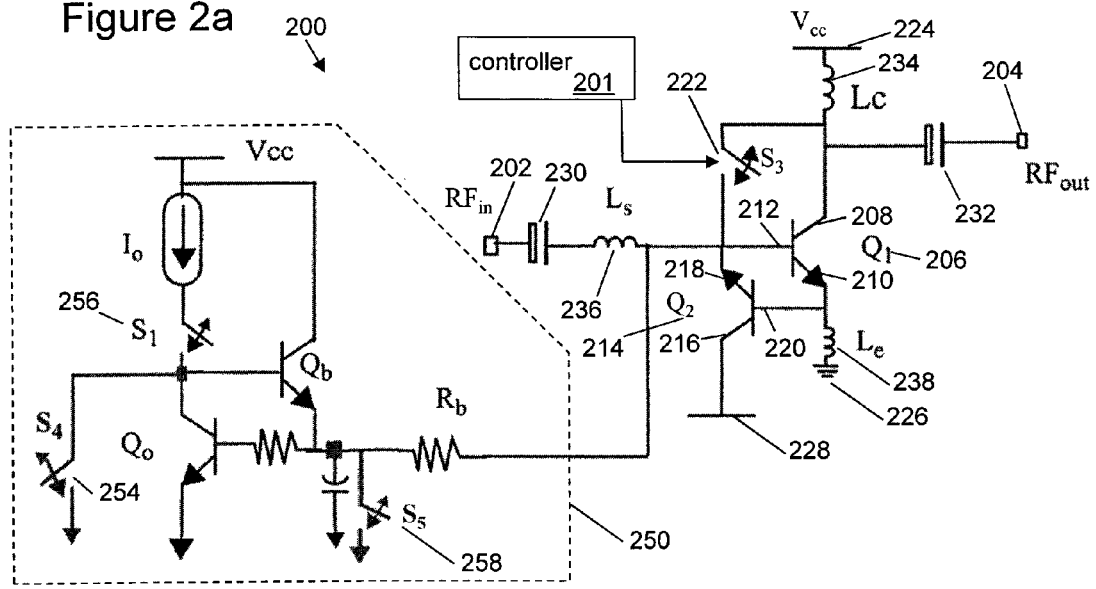
FIGS. 2a-2c illustrate a circuit diagram of an amplifier circuit comprising first and second transistors and a bypass switch.
Figure 2B:
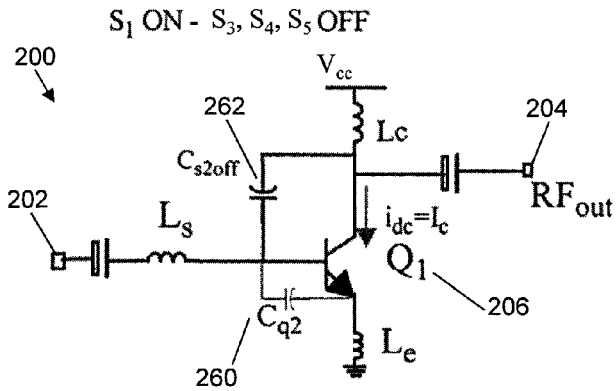
Figure 2C:
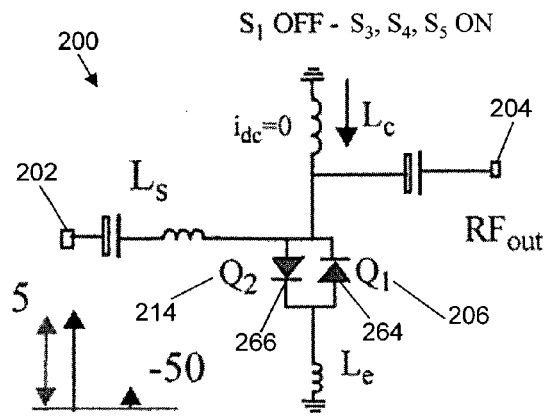

FIG. 2a shows an amplifier circuit 200 comprising two back-to-back transistors 206, 214. The amplifier circuit 200 can operate in normal and bypass modes without requiring a reverse bias to be applied. FIG. 2b illustrates how the circuit of FIG. 2a operates in the normal mode. FIG. 2c illustrates how the circuit of FIG. 2a operates in the bypass mode.

The amplifier circuit shown in FIGS. 2a-2c comprises an amplifier device (such as a transistor) in conjunction with a matched device such that even-numbered harmonics, especially the second harmonics, are reduced, minimized or cancelled when the amplifier circuit operates in the bypass mode, whilst circuit performance in the normal mode is not significantly affected. The matched device may be considered to provide a second harmonic reduction/minimising function, and may in some examples allow the amplifier circuit to yield 50 dBc second harmonic rejection performance tracking over process and temperature variation at around 5 dBm blocker levels.

The amplifier circuit 200 of FIG. 2a comprises an input terminal $RF_{in}$ 202 configured to receive a radio frequency input signal and an output terminal $RF_{out}$ 204 configured to provide a radio frequency output signal. It also comprises a first transistor $Q_1$ 206 having a first collector 208, a first emitter 210, and a first base 212, as well as a second transistor $Q_2$ 214 having a second collector 216, a second emitter 218, and a second base 220. In this example the first transistor $Q_1$ 206 is the amplifier device and the second transistor $Q_2$ is the matched device referred to above. The amplifier circuit 200 also comprises a bypass switch $S_3$ 222 and a controller 201. It will be appreciated that the controller 201 can operate all of the switches shown in FIG. 2a, although it is also illustrated as controlling the bypass switch $S_3$ 222 so as not to overcomplicate the drawing.

The first base 212 is connected to the input terminal $RF_{in}$ 202 and the second emitter 218. The input terminal $RF_{in}$ 202 is also connectable to the output terminal $RF_{out}$ 204 via the bypass switch $S_3$ 222. The first collector 208 is connected to a circuit voltage supply $V_{cc}$ 224, and to the output terminal $RF_{out}$ 204. The first emitter 210 is connected to ground 226 and to the second base 220. The second collector 216 is connected to a collector voltage supply 228, so that the second collector 216 mimics the first collector 208 of the first transistor $Q_1$ 206. The collector voltage supply 228 acts as a ground when AC signals are used in the amplifier circuit 200 because the circuit voltage supply $V_{cc}$ 224 is bypassed to AC ground in this case. The second emitter 218 is connected to the input terminal $RF_{in}$ 202 and the first base 212. The bypass switch $S_3$ 222 is connected between the input terminal $RF_{in}$ 202 and the output terminal $RF_{out}$ 204. In this example a bias circuit 250 is connected between the input terminal $RF_{in}$ 202 and a junction between the first base 212, second emitter 218, and bypass switch $S_3$ 222.

In this example, the second transistor $Q_2$ 214 and the first transistor $Q_1$ 206 are matched (they are the same type of transistor with the same characteristics such as area, form factor, shape and orientation). The primary active device for amplification is the first transistor $Q_1$ 206. The second transistor $Q_2$ 214 is added in the amplifier circuit 200 across the first transistor $Q_1$ 206 to cancel distortion created by the first transistor $Q_1$ 206. The emitter of the second transistor $Q_2$ 214 is connected to the base 212 of the active transistor $Q_1$ 206; and the base 220 of the second transistor $Q_2$ 214 is connected to the emitter 210 of the first transistor $Q_1$ 206. This advantageously provides a symmetrical circuit which acts to reduce/minimise second harmonics in the circuit 200.

The controller 201 is configured to either open or close the bypass switch $S_3$ 222 in accordance with an amplitude level of the radio frequency input signal received at the input terminal $RF_{in}$ 202. In this way the first transistor $Q_1$ 206 can be selectively bypassed. The controller 201 may be configured to compare the amplitude level of the radio frequency input signal with a predetermined amplitude threshold level to determine whether to open or close the bypass switch $S_3$ 222. There may be two predetermined threshold levels to provide for hysteresis in the circuit. If the amplitude level of the radio frequency input signal provided to the input terminal $RF_{in}$ 202 is above the predetermined amplitude threshold level then the bypass switch $S_3$ 222 is closed so that amplification is not provided. If the amplitude level of the radio frequency input signal provided to the input terminal $RF_{in}$ 202 is below the predetermined amplitude threshold level then the bypass switch $S_3$ 222 is opened so as to connect the first transistor $Q_1$ 206 in the circuit 200 and amplify the signal.

In this example, the amplifier circuit 200 also comprises a first capacitor 230 in series between the input terminal $RF_{in}$ 202 and a junction between the first base 212, the second emitter 218 and the bypass switch $S_3$ 222. The amplifier circuit 200 also comprises a second capacitor 232 in series between the output terminal $RF_{out}$ 204 and a junction between the bypass switch $S_3$ 222, the first collector 208 and the circuit voltage supply 224. The first capacitor 230 acts as a DC blocking capacitor that prevents the DC current that is provided by the bias circuit 250 from reaching an antenna that is connected to the input terminal $RF_{in}$ 202. The second capacitor 232 acts as a DC blocking capacitor that prevents the DC current that is provided by the bias circuit 250 from reaching a stage that is connected to the output terminal $RF_{out}$ 204 of the amplifier circuit 200.

In this example, the amplifier circuit 200 also comprises three inductors: a pull-up inductor $L_c$ 234 connected between the circuit voltage supply 224 and a junction between the bypass switch $S_3$ 222, the output terminal $RF_{out}$ 204 and the first collector 208; an input inductor $L_s$ 236 connected between the input terminal RF 202 and a junction between the first base 212, the second emitter 218 and the bypass switch $S_3$ 222; and a degeneration inductor $L_e$ 238 connected between ground 226 and a junction between the first emitter 210 and the second base 220. The inductors $L_c$ 234, $L_s$ 236 and $L_e$ 238 are configured to, in combination with the transistor's parasitic capacitance values, match the amplifier circuit 200 impedance to that of the source impedance.

The first transistor $Q_1$ 206 may be impedance matched with the degeneration inductor/bond-wire $L_e$ 238 and an input/input package bondwire $L_s$ 236 to a 50Ω source.

The size/area of the first transistor $Q_1$ 206 may be optimized to yield an acceptable noise performance (that is, an acceptable low level of noise in the output signal) by optimizing the level of base resistance. This also brings the "noise match" closer to 50Ω. In an ideal circuit the degeneration inductor/bond-wire $L_e$ 238 would work with the capacitance of the amplifier circuit to generate an input impedance equal to the 50Ω source. In such a case the amplifier may be considered to be impedance matched to the source.

The bias circuit 250 includes a reference transistor $Q_0$, reference current source $I_0$ and beta-helper transistor $Q_b$ that can together provide bias a current level that is independent of supply and process variation. The reference transistor $Q_0$ and the beta-helper transistor $Q_b$ are provided as part of a current mirror circuit.

The bias circuit 250 can be turned off if the first transistor $Q_1$ 206 is bypassed. Current may be prevented from passing through the transistor $Q_1$ 206 by closing the switch $S_4$ 254, closing the switch $S_5$ 258 and opening switch $S_1$ in the bias circuit 250.

First transistor $Q_1$ 206 and second transistor $Q_2$ 214 are equal (identical) and are connected opposite to each other, so they together provide an "odd" transfer function when the circuit is in the bypass mode, as described with reference equations 1 and 2 below. In this way, they provide a second harmonic "canceller". The resulting "odd" function cancels nonlinear distortions and so a very low second harmonic distortion can be achieved. This approach can be at least as effective as using a very large connection switch $S_2$ in the circuit of FIG. 1b.

For the amplifier circuit as described in relation to FIGS. 2a-2c, there may be no need to apply a reverse bias as shown in the amplifier circuit of FIG. 1b. Using the amplifier circuit 200 of FIG. 2a, it is possible to achieve 55 dB distortion, which is an acceptably low level in some applications.

In FIG. 2b the amplifier circuit 200 is shown operating in the normal mode. The bias switch $S_1$ 256 is closed. Bias switches $S_4$ 254 and $S_5$ 258 as well as bypass switch $S_3$ 222, are open. The open bypass switch $S_3$ 222 behaves as a parasitic capacitor $C_{s2off}$ 262, as shown in FIG. 2b. The second transistor $Q_2$ 214 is reverse biased (that is, it is off), and the base-emitter junction is depleted. The emitter 218 of the second transistor $Q_2$ 214 is connected to the input terminal $RF_{in}$ 202. The second collector 216 of the second transistor $Q_2$ 214 is connected to the collector voltage supply 228. Thus the collector-emitter junction of the second transistor $Q_2$ 214 is reverse-biased and acts as a small capacitive sink $C_{q2}$ 260 which only minimally affects the circuit operation. This is because it has a small capacitance compared with the capacitance $C_{\pi 1}$ across the base-emitter junction of the first transistor $Q_1$ 206, which is in parallel with the capacitive sink $C_{q2}$. The capacitance $C_{q2}$ reduces further as the charges become more separated in a reverse-biased junction.

In FIG. 2c the amplifier circuit 200 is shown operating in the bypass mode. The bias switch $S_1$ 256 is open, and bias switches $S_4$ 254 and $S_5$ 258, as well as bypass switch $S_3$ 222 are closed. When a large signal is input to the input terminal $RF_{in}$ 202 it is desirable to turn off the bias (that is, disconnect the bias circuit 250) because it is not required at the first base 212 of the first transistor $Q_1$ 206. In this way, energy is not wasted. The transistor $Q_1$ 206 then operates as a (inverted) zero bias diode (shown with reference 264 in FIG. 2c), matched with the second transistor $Q_2$ 214 which also operates as a diode (shown with reference 266 in FIG. 2c).

Figure 3A:
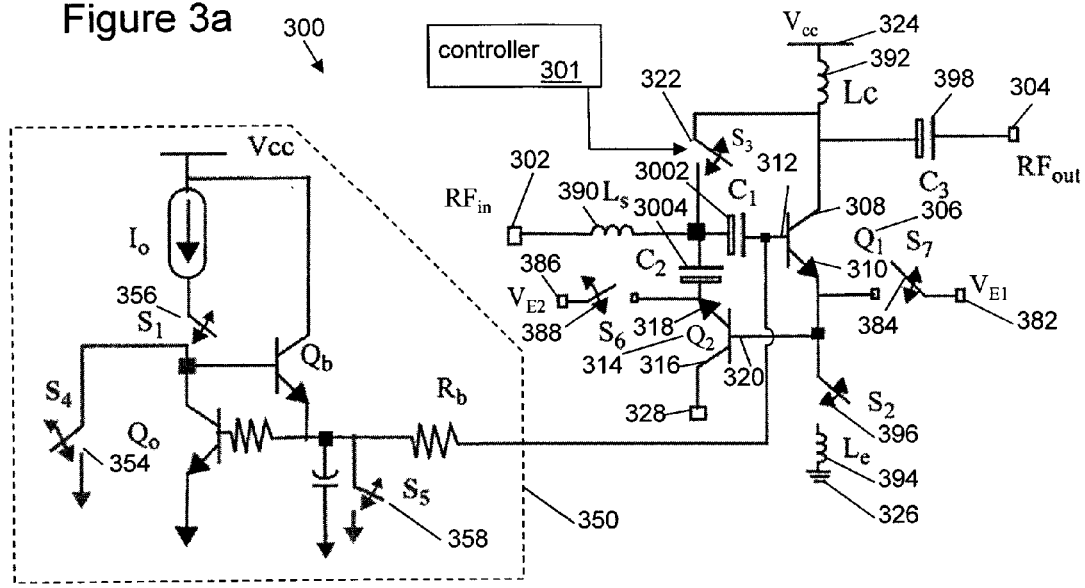
FIGS. 3a-3c illustrate a circuit diagram of an amplifier circuit comprising first and second transistors, first and second capacitors, first and second voltage sources, and a bypass switch.
Figure 3B:
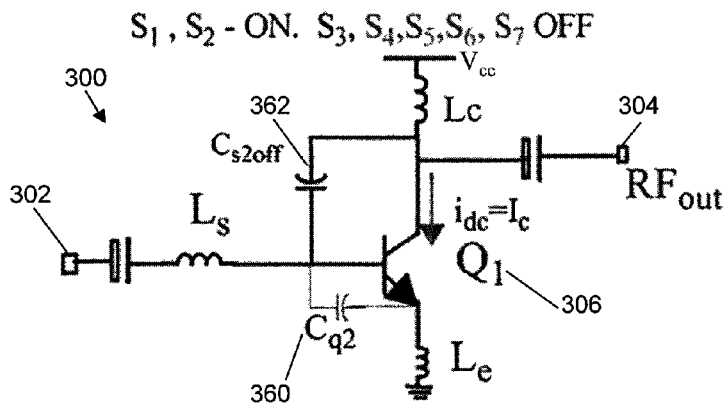
Figure 3C:
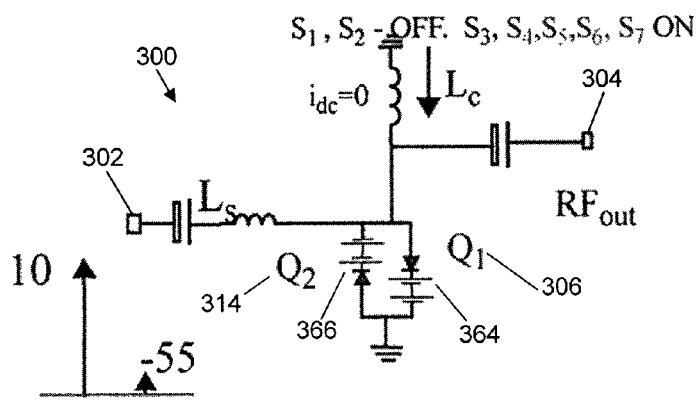

In certain examples, the second harmonic minimizing effect may be further linearized by applying appropriate bias voltages to the emitters of the first transitor and the second transistor, for example as in FIGS. 3a-3c, to achieve >65 dBc second harmonic rejection performance tracking over process and temperature variation when the blocker levels are around 11 dBm.

FIG. 3a shows an amplifier circuit 300 comprising two back-to-back transistors which may each have a voltage bias applied for improved circuit linearity. FIG. 3b illustrates how the circuit of FIG. 3a operates in the normal mode. FIG. 3c illustrates how the circuit of FIG. 3a operates in the bypass mode.

The amplifier circuit 300 of FIG. 3a includes components that are shown in FIG. 2a. Similar elements between FIGS. 2a-2c and 3a-3c have been provided with similar reference numerals, and common elements discussed in relation to FIGS. 2a-2c will not necessarily be discussed again in detail with respect to FIGS. 3a-3c.

The amplifier circuit 300 can act more linearly when the first transistor $Q_1$ 306 and the second transistor $Q_2$ 314 are reverse biased. This can act to cancel distortion in the amplifier circuit 300.

The amplifier circuit 300 in FIG. 3a comprises a first emitter bias voltage source $V_{E1}$ 382 connected to the first emitter 310 via a first emitter bias switch $S_7$ 384, and a second emitter bias voltage source $V_{E2}$ 386 connected to the second emitter 318 via a second emitter bias switch $S_6$ 388. The emitter bias voltage sources $V_{E1}$ 382 and $V_{E2}$ 386 may be switched in by the emitter bias switches $S_7$ 384 and $S_6$ 388 respectively to reverse bias the second harmonic canceling connection of the $Q_1/Q_2$ transistor pair 306, 314. This amplifier circuit 300 can provide greater than 65 dBc second harmonic rejection at input levels of 11 dBm.

The amplifier circuit 300 comprises a first capacitor $C_1$ 3002 and a second capacitor $C_2$ 3004. The first capacitor $C_1$ 3002 is connected between a junction between the input terminal $RF_{in}$ 302 and the bypass switch $S_3$ 322, and the first base 312. The second capacitor $C_2$ 3004 is connected between a junction between the input terminal $RF_{in}$ 302 and the bypass switch $S_3$ 322, and the second emitter 318. In this example, the first capacitor $C_1$ 3002 and the second capacitor $C_2$ 3004 are identical. They serve as DC blocks to prevent biases from the first emitter bias voltage source $V_{E1}$ 382 and the second emitter bias voltage source $V_{E2}$ 386 from interfering with each other. Overall the amplifier circuit 300 advantageously maintains symmetry.

The first emitter bias voltage source $V_{E1}$ 382 and second emitter bias voltage source $V_{E2}$ 386 may each be connected to a common voltage supply, and a voltage divider may be used to achieve the bias levels required. In some examples, the first emitter bias voltage source $V_{E1}$ 382 may be configured to supply a voltage that is substantially half the voltage which the second emitter bias voltage source $V_{E2}$ 386 is configured to supply. For example, if 0.8 V is connected to the first emitter 310 in reverse bias, the second transistor $Q_2$ 314 may be reverse biased by the same amount when connecting 1.6 V from the second voltage source $V_{E2}$ 386. That is, double the voltage may be applied from the second emitter bias voltage source $V_{E2}$ 386 as from the first emitter bias voltage source $V_{E1}$ 382 to balance the circuit.

FIGS. 3b and 3c show the amplifier circuit 300 operating in the normal mode and the bypass mode respectively. The reverse bias applied to the first transistor $Q_1$ 306 by the first emitter bias voltage source $V_{E1}$ in the bypass mode is shown in FIG. 3c as a voltage source 364. The reverse bias applied to the second transistor $Q_2$ 314 by the second emitter bias voltage source $V_{E2}$ in the bypass mode is shown in FIG. 3c as a voltage source 366. The first and second transistors $Q_1$ 306 and $Q_2$ 314 behave as reverse biased diodes 364, 366 when the amplifier circuit 300 operates in a bypass mode.

The amplifier circuit 300 comprises a bias circuit 350 that can provide a bias voltage to the first base 312 of the first transistor $Q_1$.

The amplifier circuit 300 of FIG. 3a may allow for further removal of second harmonic distortions when compared with the circuit of FIG. 2a. Both first and second transistors $Q_1$ 306 and $Q_2$ 314 may be reverse biased by the first emitter bias voltage source $V_{E1}$ 382 and the second emitter bias voltage source $V_{E2}$ 386 to achieve an even lower distortion. For example, a 10 dBm input signal may be received at the input terminal $RF_{in}$ 302 to meet specification standards. A 65 dB distortion reduction of the second harmonics can be achieved, which is very good. Otherwise such levels may not be achievable, or may only be achieved using, for example, a large expensive switch for the bypass switch $S_2$ as in FIG. 1a.

Amplifier circuits as disclosed herein may be constructed using commercial bipolar and BiCMOS technologies.

In the amplifier circuits 200, 300 of FIGS. 2a-2c and 3a-3c, the "odd" transfer function provided by the matched first and second transistors $Q_1$ 206, 306 and $Q_2$ 214, 314 in the bypass mode arises as described below.

In the bypass mode, when the bias is turned off, the transistors $Q_1$ 206, 306 and $Q_2$ 214, 314 act as two passive diodes 264, 364; 266, 366 connected back to back as shown in FIGS. 2c and 3c. The second transistor $Q_2$ 214, 314 is in an off state when the first transistor $Q_1$ 206, 306 is on during the normal mode, and thus the second transistor $Q_2$ 214, 314 does not significantly affect the performance of the amplifier circuit 200, 300 when operating in the normal mode.

The current through the first transistor $Q_1$, $i_1$ is defined as:

$$i_1 = i_s e^{\left(\frac{qV_{be}}{nKT}\right)},$$

where $i_s$ is the saturation current, q is charge, $V_{be}$ is the base emitter voltage, n is an ideality factor (close to 1), K is Boltzmann's constant, and T is temperature.

In the bypass mode, a transfer characteristic $$i_2 = -i_s e^{\left(\frac{-qV_{be}}{nKT}\right)}$$

is introduced, where $i_2$ is the current through the second transistor $Q_2$ 214, 314.

The net i-v characteristics of the amplifier circuit may be expressed as:

$$i = i_1 + i_2 = i_s\left(e^{\left(\frac{qV_{be}}{nKT}\right)} - e^{\left(\frac{-qV_{be}}{nKT}\right)}\right) = i_s \sinh\left[\frac{qV_{be}}{nKT}\right] \quad \text{Equation 1}$$

$$i = 2i_s \sinh\left[\frac{qV\cos(\omega_{rf}t)}{nKT}\right] = 2i_s \sum I_{2k+1}(\alpha V)\cos[(2k+1)\omega_{rf}t] \quad \text{Equation 2}$$

where $$\alpha = \frac{q}{nKT},$$

t is time and and $I_n$ is a modified Bessel function of order n.

This function has an "odd" symmetry due to the sinh function of equation 1, which is represented by the (2k+1) multiplier in equation 2. In this way, the "even-numbered" harmonics, including the second harmonic, under periodic sinusoidal excitations are cancelled out.

Thus, it will be appreciated that the addition of the second transistor $Q_2$ 214, 314 creates a nonlinear transfer function that cancels the even harmonics, which may otherwise be generated by the transistor $Q_1$ 206, 306 when the amplifier circuit 200, 300 operates in the bypass mode.

Any components that are described herein as being "coupled" or "connected" could be directly or indirectly coupled or connected. That is, one or more components could be located between two components that are said to be coupled or connected whilst still enabling the required functionality to be achieved.

The invention claimed is:

1. An amplifier circuit comprising:
   an input terminal configured to receive a radio frequency input signal;
   an output terminal configured to provide a radio frequency output signal;
   a first transistor having a first collector, a first emitter, and a first base;
   a second transistor having a second collector, a second emitter, and a second base;
   a bypass switch; and
   a controller;
   wherein
   the first base is connected to the input terminal and the second emitter;
   the first collector is connected to a circuit voltage supply and the output terminal;
   the first emitter is connected to ground and to the second base;
   the second collector is connected to a collector voltage supply;
   the bypass switch is connected between the first base and the output terminal; and
   the controller is configured to operate the amplifier circuit in a normal mode of operation or a bypass mode of operation in accordance with an amplitude level of the radio frequency input signal, wherein the controller is configured to open the bypass switch in the normal mode of operation and close the bypass switch in the bypass mode of operation to selectively bypass the first transistor.

2. The amplifier circuit of claim 1, wherein the controller is configured to compare the amplitude level of the radio frequency input signal with a predetermined amplitude threshold to determine whether to operate in the normal mode of operation or in the bypass mode of operation.

3. The amplifier circuit of claim 2, wherein the controller is configured to operate in the bypass mode of operation when the amplitude level of the radio frequency input signal is above the predetermined amplitude threshold and operate in the normal mode of operation when the amplitude level of the radio frequency input signal is below the predetermined amplitude threshold.

4. The amplifier circuit of claim 1, wherein the first transistor and second transistor are matched.

5. The amplifier circuit of claim 1, wherein the first transistor and second transistor each have one or more of: the same area; the same form factor; the same shape; and the same orientation.

6. The amplifier circuit of claim 1, further comprising a bias circuit, and wherein the controller is configured to control the bias circuit such that it provides a bias voltage to the first base of the first transistor in the normal mode of operation.

7. The amplifier circuit of claim 6, wherein the controller is configured to control the bias circuit such that the bias voltage is disconnected from the first base of the first transistor in the bypass mode of operation.

8. The amplifier circuit of claim 1, wherein the amplifier circuit comprises:
   a first emitter bias voltage source selectively connectable to the first emitter via a first voltage emitter bias source switch; and
   a second emitter bias voltage source selectively connectable to the second emitter via a second emitter bias switch; and
   wherein the controller is configured to operate the first emitter bias switch and the second emitter bias switch in the bypass mode of operation such that bias voltages are applied to the first emitter and the second emitter.

9. The amplifier circuit of claim 8, wherein the controller is configured to operate the first emitter bias switch and the second emitter bias switch in the normal mode of operation such that bias voltages are disconnected from the first emitter and the second emitter.

10. The amplifier circuit of claim 8, wherein the first emitter bias voltage source is configured to supply a voltage which is substantially half the voltage which the second emitter bias voltage source is configured to supply.

11. The amplifier circuit of claim 1, wherein the amplifier circuit further comprises a first capacitor and a second capacitor, wherein the first capacitor is connected between:
   a junction between the input terminal and the bypass switch; and
   the first base;
   and the second capacitor is connected between:
   a junction between the input terminal and the bypass switch; and
   the second emitter.

12. The amplifier circuit of claim 1, wherein the amplifier circuit comprises one or more of:
   an input capacitor between the input terminal and a junction between the first base, the second emitter and the bypass switch, and
   an output capacitor between the output terminal and a junction between the bypass switch, the first collector and a voltage source.

13. The amplifier circuit of claim 1, wherein the amplifier circuit comprises one or more of:
   a pull-up inductor connected between a circuit supply voltage and a junction between the bypass switch, the output terminal and the first collector;
   an input inductor connected between the input terminal and a junction between the first base, the second emitter and the bypass switch; and
   a degeneration inductor connected between ground and a junction between the first emitter and the second base.

14. An electronic device comprising the amplifier circuit as claimed in any one of claims 1-13.

15. An integrated circuit comprising the amplifier circuit as claimed in any one of claims 1-13.

16. The amplifier circuit of claim 1, further comprising a bias circuit configured to provide a bias voltage to the first base of the first transistor in the normal mode of operation, the bias circuit including
   a reference current source,
   a current mirror coupled to the reference current source and configured to provide a bias current that is independent of supply and process variation, and
   a second switch having a first end connected to an output of the current source and a second end coupled to the current mirror.

17. The amplifier circuit of claim 16, wherein the current mirror includes:

a third transistor having a collector connected to the second end of the second switch; and a fourth transistor having a base connected to the second end of the second switch and an emitter connected to the base of the third transistor.

18. The amplifier circuit of claim 17, wherein:

the emitter of the fourth transistor is connected to the base of the third transistor via a first resistor; and the fourth transistor is connected to the base of the first transistor via a second resistor.

19. The amplifier circuit of claim 16, wherein the bias control circuit further includes:

a third switch having a first end connected to the second end of the first switch a second end connected to the ground; and a fourth switch having a first end connected to an output of the current mirror a second end connected to the ground.

20. The amplifier circuit of claim 19, wherein the controller is further configures and arranged to:

in the normal mode, close the second switch and open the third and fourth switches; and in the bypass mode, open the second switch and close the third and fourth switches.

* * * * *